US012663721B2

(12) United States Patent
Bae et al.

(10) Patent No.: US 12,663,721 B2
(45) Date of Patent: Jun. 23, 2026

(54) APPARATUS AND METHOD FOR TREATING SUBSTRATE

(71) Applicant: SEMES CO., LTD., Cheonan-si (KR)

(72) Inventors: Moon Hyung Bae, Daegu (KR); Hye Bin Baek, Incheon (KR); Youngseo An, Osan-si (KR); Euntark Lee, Cheonan-si (KR); Min Jung Park, Daegu (KR); Seunghan Lee, Cheonan-si (KR); Jung-Hyun Lee, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 127 days.

(21) Appl. No.: 18/310,704

(22) Filed: May 2, 2023

(65) Prior Publication Data

US 2023/0288811 A1     Sep. 14, 2023

Related U.S. Application Data

(62) Division of application No. 17/084,903, filed on Oct. 30, 2020, now abandoned.

(30) Foreign Application Priority Data

Oct. 31, 2019     (KR) ........................ 10-2019-0137962

(51) Int. Cl.
*G03F 7/16*          (2006.01)
*H10P 14/00*        (2026.01)
          (Continued)
(52) U.S. Cl.
CPC .............. *G03F 7/167* (2013.01); *H10P 14/00* (2026.01); *H10P 72/0402* (2026.01);
          (Continued)

(58) Field of Classification Search
CPC ......... H01L 21/02104; H01L 21/67017; H01L 21/67103; H01L 21/68742;
          (Continued)

(56) References Cited

U.S. PATENT DOCUMENTS 6,143,086 A      11/2000  Tepman
9,909,213 B2 *    3/2018  Shoji ................. C23C 16/45591
          (Continued)

FOREIGN PATENT DOCUMENTS

CN          106971960 A      7/2017
CN          109545702 A      3/2019
          (Continued)

OTHER PUBLICATIONS

Office Action for Korean Application No. 10-2019-0137962 dated Feb. 23, 2021.
          (Continued)

*Primary Examiner* — Brian K Talbot
(74) *Attorney, Agent, or Firm* — Harness, Dickey & Pierce, P.L.C.

(57)          ABSTRACT

The inventive concept provides an apparatus and method for treating a substrate with a gas. The apparatus includes a chamber having a process space in which the substrate is treated, a substrate support unit that supports the substrate in the process space, a gas supply unit that supplies a hydrophobic gas onto the substrate supported on the substrate support unit, and a controller that controls the substrate support unit and the gas supply unit. The substrate support unit includes a support plate on which the substrate is placed and a pin assembly that raises the substrate off the support plate or lowers the substrate onto the support plate, and the controller controls a degree of hydrophobization of a surface of the substrate by adjusting the pin assembly.

6 Claims, 11 Drawing Sheets

(51) Int. Cl.

| | | |
|---|---|---|
| *H10P 72/00* | (2026.01) |
| *H10P 72/76* | (2026.01) |
| *H10P 14/60* | (2026.01) |
| *H10P 72/30* | (2026.01) |
| *H10P 72/70* | (2026.01) |

(52) U.S. Cl.
CPC ...... *H10P 72/0432* (2026.01); *H10P 72/7612* (2026.01); *H10P 14/6512* (2026.01); *H10P 72/0424* (2026.01); *H10P 72/0448* (2026.01); *H10P 72/0606* (2026.01); *H10P 72/3302* (2026.01); *H10P 72/3402* (2026.01); *H10P 72/70* (2026.01); *H10P 72/7602* (2026.01)

(58) Field of Classification Search
CPC ............. H01L 21/023112; G03F 7/167; H10P 72/0402; H10P 72/0432; H10P 72/7612; H10P 72/0424; H10P 72/3302; H10P 72/3402; H10P 72/7602; H10P 72/0448; H10P 72/0606; H10P 72/70; H10P 14/6512; H10P 14/6529
USPC ...................................................... 427/248.1
See application file for complete search history.

(56) References Cited

U.S. PATENT DOCUMENTS

| | | | | |
|---|---|---|---|---|
| 11,145,524 | B2 * | 10/2021 | Chi ..................... | H10P 72/0432 |
| 11,220,750 | B2 * | 1/2022 | Noyori .............. | C23C 16/45565 |
| 2001/0021486 | A1 * | 9/2001 | Kitano ...................... | G03F 7/16 |
| | | | | 430/327 |
| 2005/0065634 | A1 * | 3/2005 | Nakajima ........... | H01L 21/6875 |
| | | | | 700/213 |
| 2006/0160253 | A1 | 7/2006 | Kim et al. | |
| 2009/0207390 | A1 * | 8/2009 | Fukuoka .................... | C09J 5/02 |
| | | | | 156/308.6 |
| 2012/0000886 | A1 * | 1/2012 | Honda ................ | H10P 72/0462 |
| | | | | 156/345.1 |
| 2014/0113144 | A1 * | 4/2014 | Loth ..................... | B08B 17/065 |
| | | | | 524/391 |

| | | | | |
|---|---|---|---|---|
| 2016/0089685 | A1 * | 3/2016 | Kimura ................. | H01L 21/306 |
| | | | | 427/256 |
| 2017/0114456 | A1 * | 4/2017 | Lee ...................... | C23C 16/4412 |
| 2017/0136489 | A1 * | 5/2017 | Maeda .................. | G03F 7/3092 |
| 2017/0140976 | A1 | 5/2017 | Abe et al. | |
| 2017/0372926 | A1 | 12/2017 | Kim et al. | |
| 2018/0182612 | A1 * | 6/2018 | Fukuoka .......... | H01L 21/67017 |
| 2019/0067046 | A1 * | 2/2019 | Hinode ............ | H01L 21/67034 |
| 2019/0295863 | A1 * | 9/2019 | Inagaki ............ | H01L 21/67173 |
| 2021/0028028 | A1 * | 1/2021 | Chi ..................... | H10P 72/0432 |
| 2021/0057239 | A1 * | 2/2021 | Kim ................... | H10P 72/0434 |
| 2021/0129175 | A1 | 5/2021 | Bang et al. | |
| 2021/0132499 | A1 * | 5/2021 | Bae ..................... | H01L 21/6708 |
| 2021/0317579 | A1 * | 10/2021 | Matsunaga ............. | C23C 16/52 |
| 2022/0076929 | A1 * | 3/2022 | Kim .................. | H01J 37/32642 |

FOREIGN PATENT DOCUMENTS

| | | | |
|---|---|---|---|
| JP | 3203796 U | | 8/1992 |
| JP | 2015-079779 A | | 4/2015 |
| JP | 2016-046515 A | | 4/2016 |
| KR | 200159498 Y1 | | 10/1999 |
| KR | 10-2001-0088427 A | | 9/2001 |
| KR | 10-2008-0018455 A | | 2/2008 |
| KR | 10-2012-0034110 A | | 4/2012 |
| KR | 10-2015-0078629 A | | 7/2015 |
| KR | 10-2016-0023562 A | | 3/2016 |
| KR | 20160023562 A | * | 3/2016 |
| KR | 10-2018-0021263 A | | 3/2018 |
| KR | 10-2019-0012965 A | | 2/2019 |
| KR | 10-2019-0042861 A | | 4/2019 |

OTHER PUBLICATIONS

Korean Notice of Allowance dated Aug. 2, 2021 for corresponding Korean Application No. 2021-061147828.

Japanese Office Action dated Nov. 15, 2022 issued in corresponding Japanese Appln. No. 2020-179228.

Chinese Office Action dated Dec. 29, 2023 for corresponding Chinese Patent Application No. 202011203513.4.

* cited by examiner

APPARATUS AND METHOD FOR TREATING SUBSTRATE

CROSS-REFERENCE TO RELATED APPLICATIONS

This application is a divisional of U.S. application Ser. No. 17/084,903, filed on Oct. 30, 2020, which claims priority under 35 U.S.C. § 119 to Korean Patent Application No. 10-2019-0137962 filed on Oct. 31, 2019, in the Korean Intellectual Property Office, the entire contents of each of which are hereby incorporated by reference.

BACKGROUND

Embodiments of the inventive concept described herein relate to an apparatus and method for treating a substrate, and more particularly, relate to an apparatus and method for treating a substrate with a gas.

Various processes, such as cleaning, deposition, photolithography, etching, ion implantation, and the like, are performed to manufacture semiconductor devices. These processes are performed in chambers having process spaces inside, respectively.

The photolithography process includes a coating process of forming a coating film on a substrate, and surface modification of the substrate has to be performed before the coating film is formed. The surface modification is a process of modifying the property of the substrate surface to a property that is the same as, or similar to, that of the coating film. The surface modification includes a process of supplying a process gas to the surface of the substrate. For example, the coating film may have a hydrophobic property, and the process gas may include a hydrophobic gas.

The hydrophobic gas hydrophobicizes the surface of the substrate, and the degree of hydrophobization serves as an important factor affecting the adhesion and thickness of the coating film. Accordingly, the degree of hydrophobization may be differently applied depending on the property and type of the coating film, a process, and an environment.

However, the hydrophobic gas is a gas generated by gasifying a hydrophobic liquid, and it is difficult to adjust the flow rate of the hydrophobic gas. For example, the hydrophobic gas may be formed by supplying a vaporized gas to the hydrophobic liquid. In a case where an adjustment member such as a valve is installed to adjust the flow rate of the hydrophobic gas, the supply of the vaporized gas may be affected.

Due to this, to differently apply the degree of hydrophobization, hydrophobization processes have to be performed in apparatuses having different environments.

SUMMARY

Embodiments of the inventive concept provide an apparatus and method for adjusting the degree of hydrophobization of a substrate surface.

Furthermore, embodiments of the inventive concept provide an apparatus and method for differently applying the degree of hydrophobization of a substrate surface in the same apparatus.

According to an exemplary embodiment, an apparatus for treating a substrate includes a chamber having a process space in which the substrate is treated, a substrate support unit that supports the substrate in the process space, a gas supply unit that supplies a hydrophobic gas onto the substrate supported on the substrate support unit, and a controller that controls the substrate support unit and the gas supply unit. The substrate support unit includes a support plate on which the substrate is placed and a pin assembly that raises the substrate off the support plate or lowers the substrate onto the support plate, and the controller controls a degree of hydrophobization of a surface of the substrate by adjusting the pin assembly.

The controller may move a first substrate to a first height such that a surface of the first substrate has a first hydrophobic property and may move a second substrate to a second height such that a surface of the second substrate has a second hydrophobic property. The first hydrophobic property may have a higher degree of hydrophobization than the second hydrophobic property, and the first height may be closer to the gas supply unit than the second height. The gas supply unit may include a gas supply tube that supplies the hydrophobic gas into the process space and that is located over the support plate, a dispensing end of the gas supply tube may be located to overlap the support plate when viewed from above, and the first height may be closer to the dispensing end than the second height. The controller may control the gas supply unit such that a flow rate of the hydrophobic gas dispensed from the gas supply tube is constant.

The first height may be a height at which the first substrate is spaced apart from the support plate, and the second height may be a height at which the second substrate is seated on the support plate.

The first height may be a height at which the first substrate is spaced apart from the support plate, and the second height may be a height at which the second substrate is spaced apart from the support plate.

According to an exemplary embodiment, a method for treating a substrate includes a first treatment step of hydrophobicizing a surface of a first substrate such that the surface of the first substrate has a first hydrophobic property, by supplying a hydrophobic gas to the first substrate and a second treatment step of hydrophobicizing a surface of a second substrate such that the surface of the second substrate has a second hydrophobic property, by supplying a hydrophobic gas to the second substrate. The first hydrophobic property and the second hydrophobic property have different degrees of hydrophobization, and a first distance between a dispensing end through which the hydrophobic gas is dispensed and the first substrate in the first treatment step is different from a second distance between the dispensing end through which the hydrophobic gas is dispensed and the second substrate in the second treatment step.

The first hydrophobic property may have a higher degree of hydrophobization than the second hydrophobic property, and the first distance may be smaller than the second distance. The hydrophobic gas used in the first treatment step may be the same as the hydrophobic gas used in the second treatment step. The first treatment step and the second treatment step may be performed in the same chamber.

The dispensing end through which the hydrophobic gas is dispensed may face a support plate that supports the first substrate and the second substrate and may be located to overlap the support plate when viewed from above. The dispensing end may be located to face the center of the first substrate and the center of the second substrate.

The hydrophobic gas may be dispensed at the same flow rate in the first treatment step and the second treatment step.

The hydrophobic gas may include a hexamethyldisilane (HMDS) gas.

According to an exemplary embodiment, a method for treating a substrate includes hydrophobicizing a surface of the substrate by supplying a hydrophobic gas to the substrate, in which a degree of hydrophobization of the surface is adjusted by adjusting a position of the substrate.

The adjusting of the position of the substrate may include adjusting a distance between a dispensing position in which the hydrophobic gas is dispensed and the substrate.

The dispensing position may be located over the substrate. The degree of hydrophobization may be adjusted by moving the substrate to a first height such that the surface has a first hydrophobic property, or by moving the substrate to a second height such that the surface has a second hydrophobic property. The first height may be higher than the second height. The first hydrophobic property may have a higher degree of hydrophobization than the second hydrophobic property.

A flow rate at which the hydrophobic gas is dispensed may be constant. The hydrophobic gas may include a hexamethyldisilane (HMDS) gas.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 3 is a plan view illustrating the substrate treating apparatus of FIG. 2;

FIG. 10 is a view illustrating a process of treating a first substrate in the apparatus of FIG. 7;

DETAILED DESCRIPTION

Figure 1:
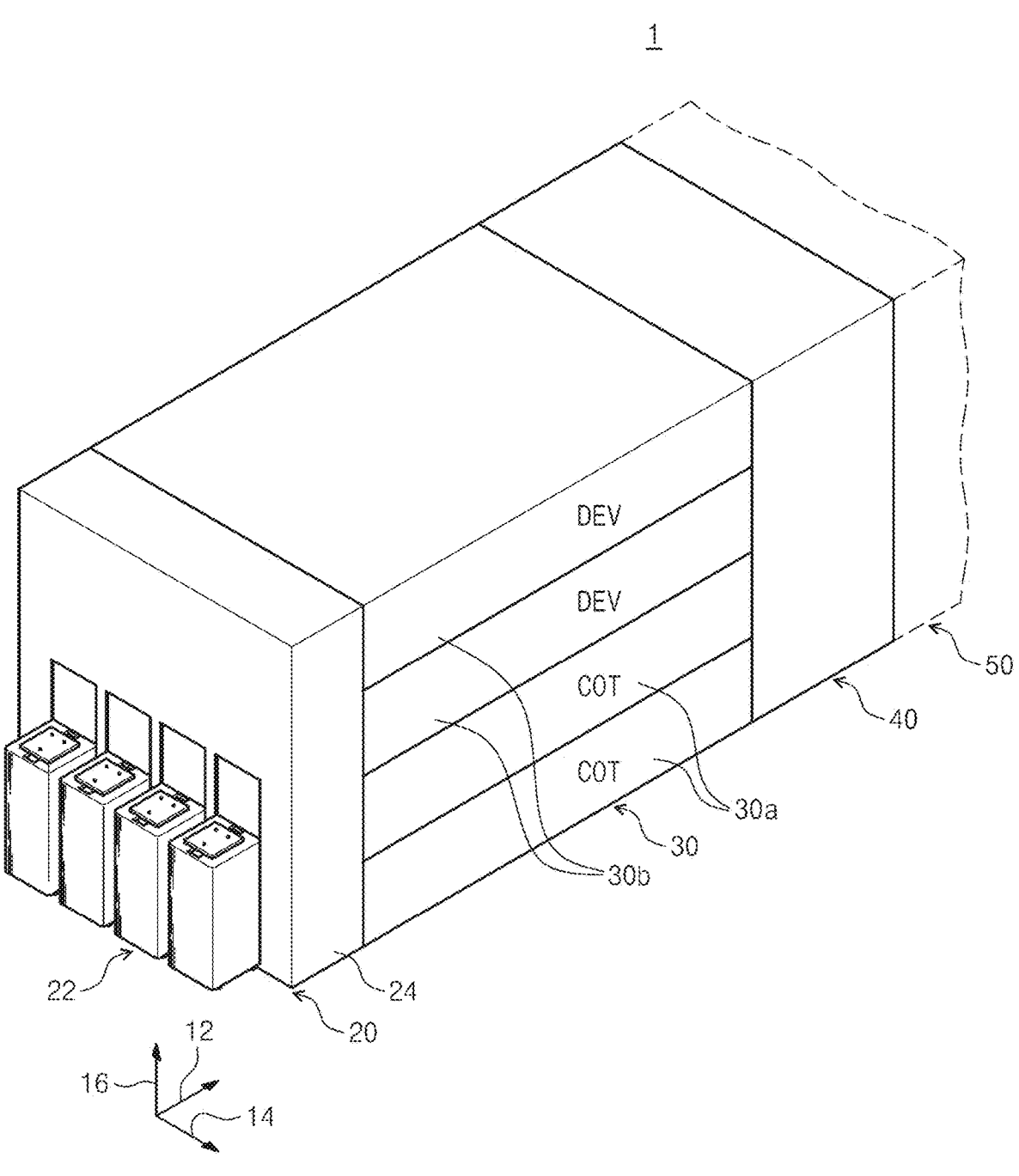
FIG. 1 is a schematic perspective view illustrating a substrate treating apparatus according to an embodiment of the inventive concept.

Hereinafter, embodiments of the inventive concept will be described in more detail with reference to the accompanying drawings. The inventive concept may, however, be embodied in different forms and should not be construed as limited to the embodiments set forth herein. Rather, these embodiments are provided so that the inventive concept will be thorough and complete, and will fully convey the scope of the inventive concept to those skilled in the art. In the drawings, the dimensions of components are exaggerated for clarity of illustration.

Figure 2:
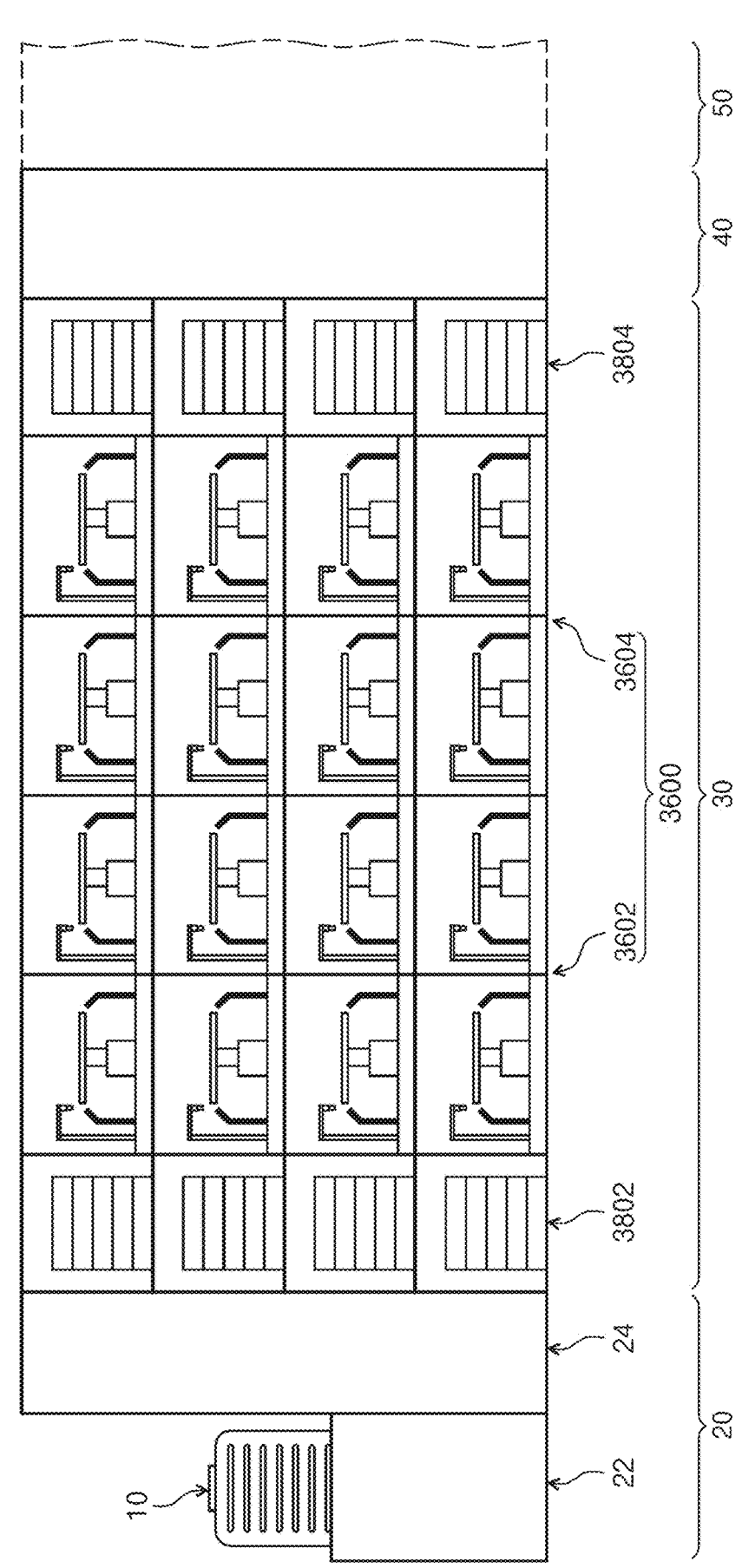
FIG. 2 is a sectional view illustrating coating blocks and developing blocks of the substrate treating apparatus of FIG. 1.
Figure 3:
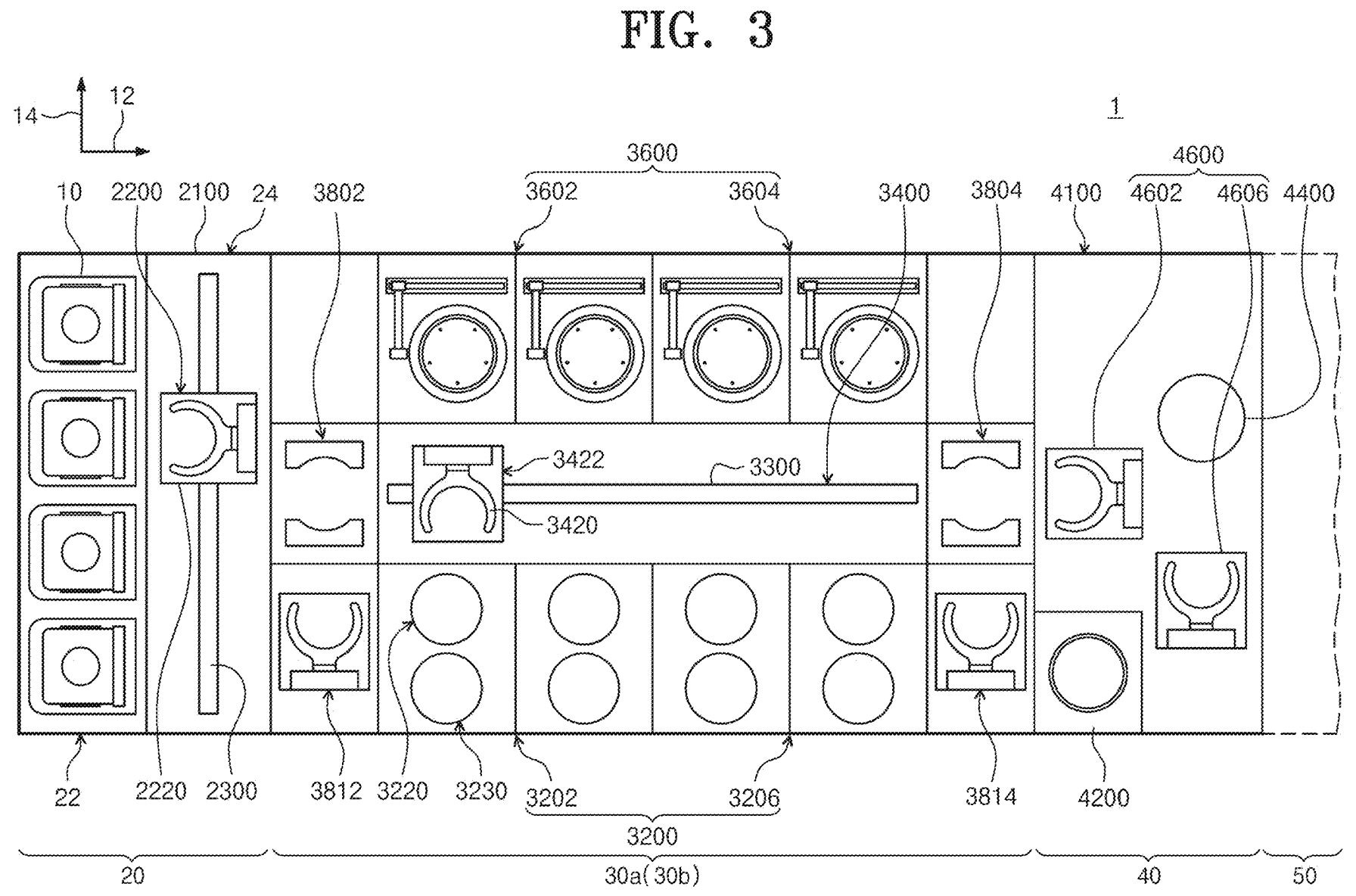

FIG. 1 is a schematic perspective view illustrating a substrate treating apparatus according to an embodiment of the inventive concept. FIG. 2 is a sectional view illustrating coating blocks and developing blocks of the substrate treating apparatus of FIG. 1. FIG. 3 is a plan view illustrating the substrate treating apparatus of FIG. 2. Referring to FIGS. 1 to 3, the substrate treating apparatus 1 includes an index module 20, a treating module 30, and an interface module 40. According to an embodiment, the index module 20, the treating module 30, and the interface module 40 are sequentially disposed in a row. Hereinafter, a direction in which the index module 20, the treating module 30, and the interface module 40 are arranged is referred to as a first direction 12, a direction perpendicular to the first direction 12 when viewed from above is referred to as a second direction 14, and a direction perpendicular to the first direction 12 and the second direction 14 is referred to as a third direction 16.

The index module 20 transfers substrates W from carriers 10 having the substrates W received therein to the treating module 30 and places the completely treated substrates W in the carriers 10. The lengthwise direction of the index module 20 is parallel to the second direction 14. The index module 20 has load ports 22 and an index frame 24. The load ports 22 are located on the opposite side to the treating module 30 with respect to the index frame 24. The carriers 10, each of which has the substrates W received therein, are placed on the load ports 22. The load ports 22 may be disposed along the second direction 14.

Airtight carriers such as front open unified pods (FOUPs) may be used as the carriers 10. The carriers 10 may be placed on the load ports 22 by a transfer unit (not illustrated) such as an overhead transfer, an overhead conveyor, or an automatic guided vehicle, or by an operator.

An index robot 2200 is provided in the index frame 24. A guide rail 2300, the lengthwise direction of which is parallel to the second direction 14, is provided in the index frame 24, and the index robot 2200 is movable on the guide rail 2300. The index robot 2200 includes hands 2220 on which the substrates W are placed. The hands 2220 are movable forward and backward, rotatable about an axis facing in the third direction 16, and movable along the third direction 16.

The treating module 30 performs a coating process and a developing process on the substrates W. The treating module 30 has the coating blocks 30a and the developing blocks 30b. The coating blocks 30a perform the coating process on the substrates W, and the developing blocks 30b perform the developing process on the substrates W. The coating blocks 30a are stacked on each other. The developing blocks 30b are stacked on each other. According to this embodiment, two coating blocks 30a and two developing block 30b are provided. The coating blocks 30a may be disposed under the developing blocks 30b. According to an embodiment, the two coating blocks 30a may perform the same process and may have the same structure. Furthermore, the two developing blocks 30b may perform the same process and may have the same structure.

Each of the coating blocks 30a has heat treatment chambers 3200, a transfer chamber 3400, liquid treatment chambers 3600, and buffer chambers 3800. Each of the heat treatment chambers 3200 performs a heat treatment process on the substrate W. The heat treatment process may include a cooling process and a heating process. Each of the liquid treatment chambers 3600 forms a liquid film on the substrate W by dispensing a liquid onto the substrate W. The liquid film may be a photoresist film or an anti-reflection film. The transfer chamber 3400 transfers the substrate W between the heat treatment chamber 3200 and the liquid treatment chamber 3600 in the coating block 30*a*.

The transfer chamber 3400 is disposed such that the lengthwise direction thereof is parallel to the first direction 12. A transfer robot 3422 is provided in the transfer chamber 3400. The transfer robot 3422 transfers the substrate W between the heat treatment chamber 3200, the liquid treatment chamber 3600, and the buffer chambers 3800. According to an embodiment, the transfer robot 3422 has a hand 3420 on which the substrate W is placed, and the hand 3420 is movable forward and backward, rotatable about an axis facing in the third direction 16, and movable along the third direction 16. A guide rail 3300, the lengthwise direction of which is parallel to the first direction 12, is provided in the transfer chamber 3400, and the transfer robot 3422 is movable on the guide rail 3300.

Figure 4:
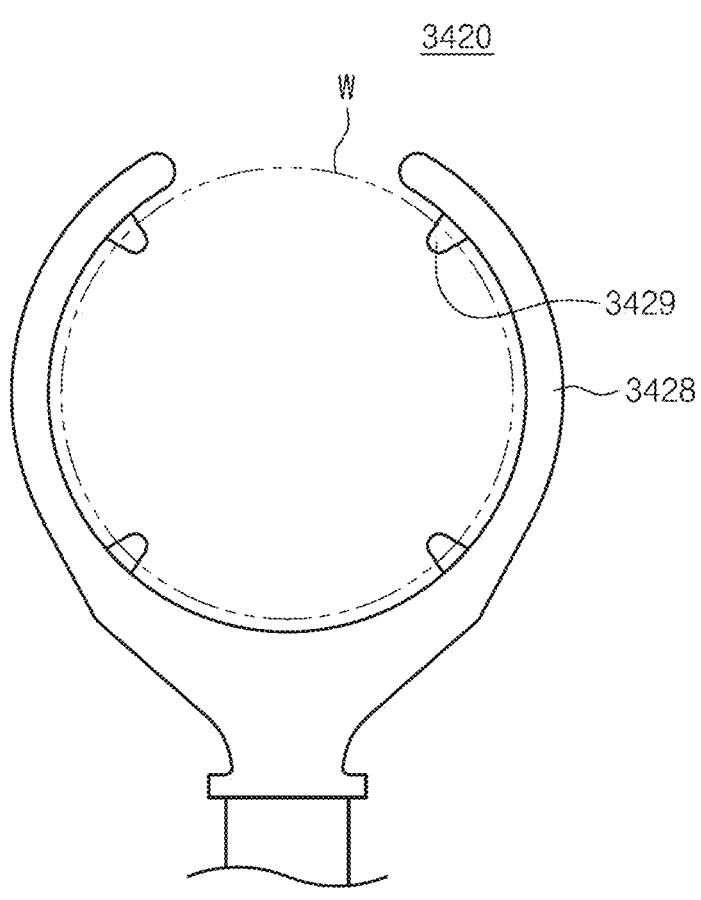
FIG. 4 is a view illustrating one example of a hand of a transfer robot of FIG. 3.

FIG. 4 is a view illustrating one example of the hand of the transfer robot of FIG. 3. Referring to FIG. 4, the hand 3420 has a base 3428 and support protrusions 3429. The base 3428 may have an annular ring shape, the circumference of which is partly curved. The base 3428 has an inner diameter greater than the diameter of the substrate W. The support protrusions 3429 extend inward from the base 3428. The support protrusions 3429 support an edge region of the substrate W. According to an embodiment, four support protrusions 3429 may be provided at equal intervals.

The heat treatment chambers 3200 are arranged along the first direction 12. The heat treatment chambers 3200 are located on one side of the transfer chamber 3400. Among the heat treatment chambers 3200, a heat treatment chamber 3202 located closest to the index module 20 performs heat treatment on the substrate W before the substrate W is transferred to the liquid treatment chamber 3600, and the other heat treatment chambers 3206 perform heat treatment on the substrate W treated with a liquid in the liquid treatment chamber 3600. In this embodiment, the heat treatment chamber located closest to the index module 20 is defined as the front heat treatment chamber 3202.

In this embodiment, the heat treatment chamber 3202 located at the front end among the plurality of heat treatment chambers 3200 will be described. The front heat treatment chamber 3202 may improve adhesion of photoresist to the substrate W by supplying a process gas while heating the substrate W. The process gas modifies the surface of the substrate W. The process gas changes the surface of the substrate W from a hydrophilic surface to a hydrophobic surface. According to an embodiment, the process gas may be a hexamethyldisilane gas. The process gas is not supplied to the heat treatment chamber 3200 located at the rear end.

Figure 5:
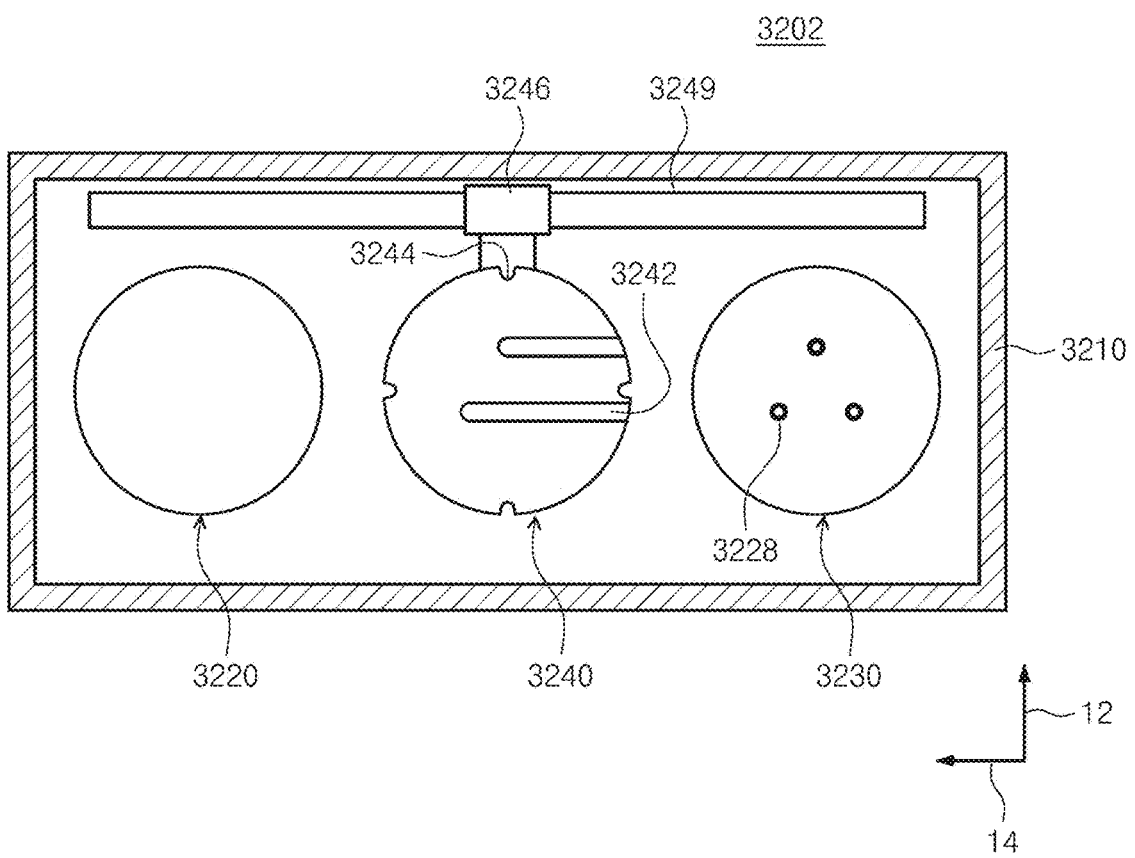
FIG. 5 is a schematic plan view illustrating one example of a heat treatment chamber of FIG. 3.
Figure 6:
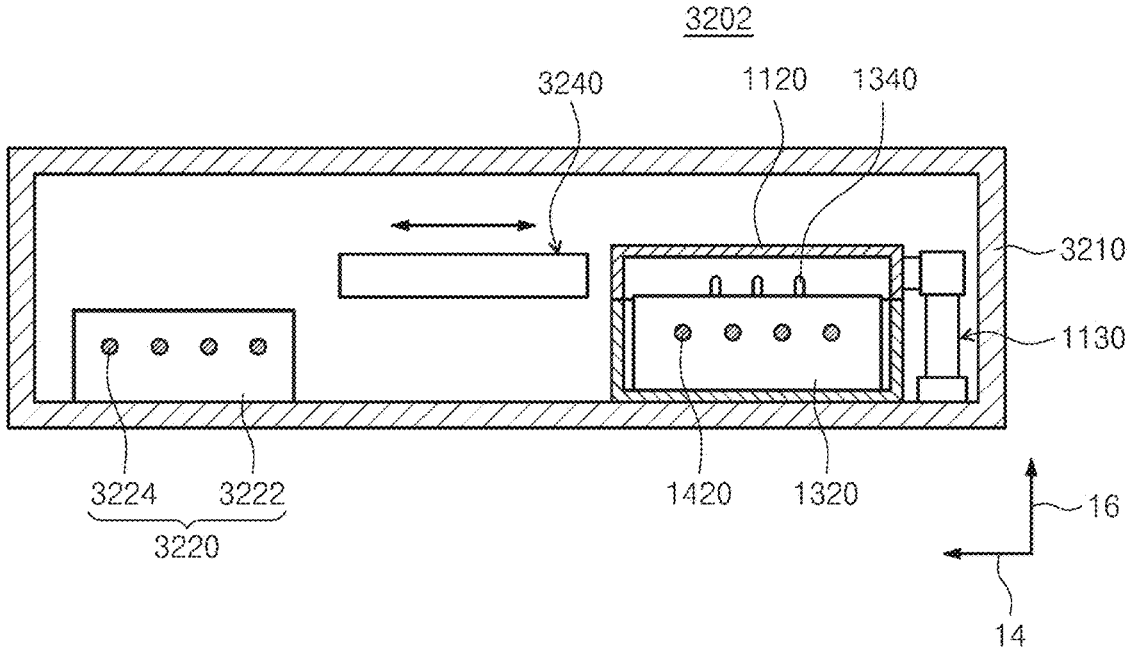
FIG. 6 is a front view of the heat treatment chamber of FIG. 5.

FIG. 5 is a schematic plan view illustrating one example of the heat treatment chamber of FIG. 3, and FIG. 6 is a front view of the heat treatment chamber of FIG. 5. Referring to FIGS. 5 and 6, the heat treatment chamber 3202 has a housing 3210, a cooling unit 3220, a heating unit 3230, and a transfer plate 3240.

The housing 3210 has a substantially rectangular parallelepiped shape. The housing 3210 has, in a sidewall thereof, an entrance/exit opening (not illustrated) through which the substrate W enters and exits the housing 3210. The entrance/exit opening may be maintained in an open state. Selectively, a door (not illustrated) may be provided to open and close the entrance/exit opening. The cooling unit 3220, the heating unit 3230, and the transfer plate 3240 are provided in the housing 3210. The cooling unit 3220 and the heating unit 3230 are provided side by side along the second direction

14. According to an embodiment, the cooling unit 3220 may be located closer to the transfer chamber 3400 than the heating unit 3230.

The cooling unit 3220 has a cooling plate 3222. The cooling plate 3222 may have a substantially circular shape when viewed from above. A cooling member 3224 is provided inside the cooling plate 3222. According to an embodiment, the cooling member 3224 may be formed inside the cooling plate 3222 and may serve as a fluid channel through which a cooling fluid flows.

Figure 7:
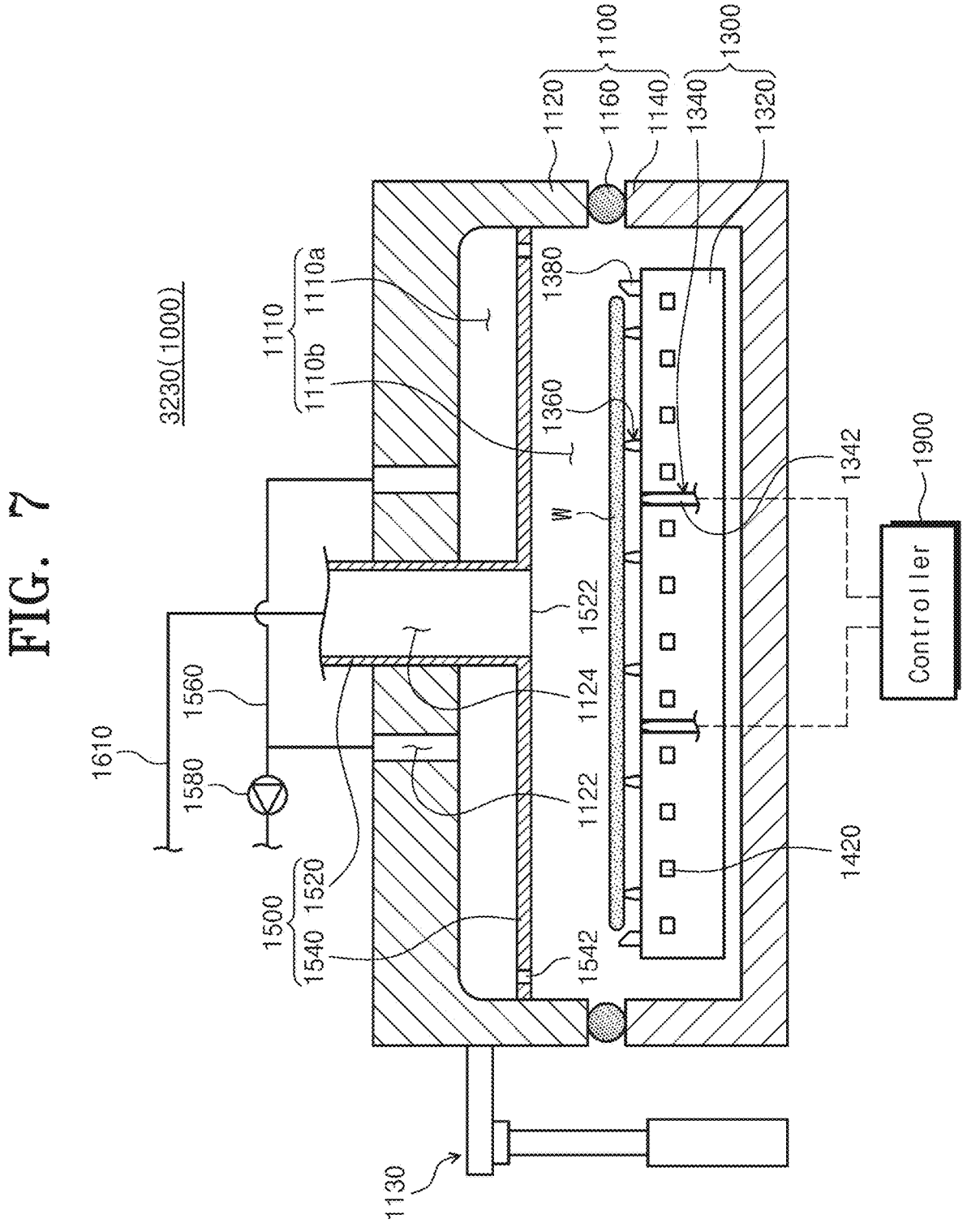
FIG. 7 is a sectional view illustrating a heating unit of FIG. 6.

The heating unit 3230 is implemented with an apparatus 1000 that heats the substrate W to a temperature higher than the room temperature. The heating unit 3230 heats the substrate W in an atmospheric atmosphere or in an atmosphere of reduced pressure lower than the atmospheric pressure. FIG. 7 is a sectional view illustrating the heating unit of FIG. 6. Referring to FIG. 7, the heating unit 3230 includes a chamber 1100, a substrate support unit 1300, a heater unit 1400, a gas supply unit 1500 (or gas supplier), and a controller 1900.

The chamber 1100 has a process space 1110 therein in which heat treatment is performed on the substrate W. The process space 1110 is sealed from the outside. The chamber 1100 includes an upper body 1120, a lower body 1140, and a sealing member 1160.

The upper body 1120 has a container shape that is open at the bottom. The upper body 1120 has a central hole 1124 and peripheral holes 1122 formed in an upper wall thereof. The central hole 1124 is formed in the center of the upper body 1120. The central hole 1124 functions as an inlet hole 1124 through which a process gas is introduced into the chamber 1100. The peripheral holes 1122 are used to evacuate an atmosphere in the process space 1110. The peripheral holes 1122 are spaced apart from each other and are arranged to surround the central hole 1124. According to an embodiment, four peripheral holes 1122 may be provided.

The lower body 1140 has a container shape that is open at the top. The lower body 1140 is located under the upper body 1120. The upper body 1120 and the lower body 1140 are located to face each other in an up-down direction. The upper body 1120 and the lower body 1140 are combined with each other to form the process space 1110 inside. The upper body 1120 and the lower body 1140 are located such that the central axes thereof are aligned with each other in the up-down direction. The lower body 1140 may have the same diameter as the upper body 1120. That is, an upper end of the lower body 1140 may be located to face a lower end of the upper body 1120.

One of the upper body 1120 and the lower body 1140 is moved to an open position or a closed position by a lifting member 1130, and the other is fixed in position. In this embodiment, it is exemplified that the lower body 1140 is fixed in position and the upper body 1120 is moved. The open position is a position in which the upper body 1120 and the lower body 1140 are spaced apart from each other and therefore the process space 1110 is open. The closed position is a position in which the process space 1110 is sealed from the outside by the lower body 1140 and the upper body 1120.

The sealing member 1160 is located between the upper body 1120 and the lower body 1140. The sealing member 1160 seals the process space 1110 from the outside when the upper body 1120 and the lower body 1140 are brought into contact with each other. The sealing member 1160 may have an annular ring shape. The sealing member 1160 may be fixedly coupled to the upper end of the lower body 1140.

Figure 8:
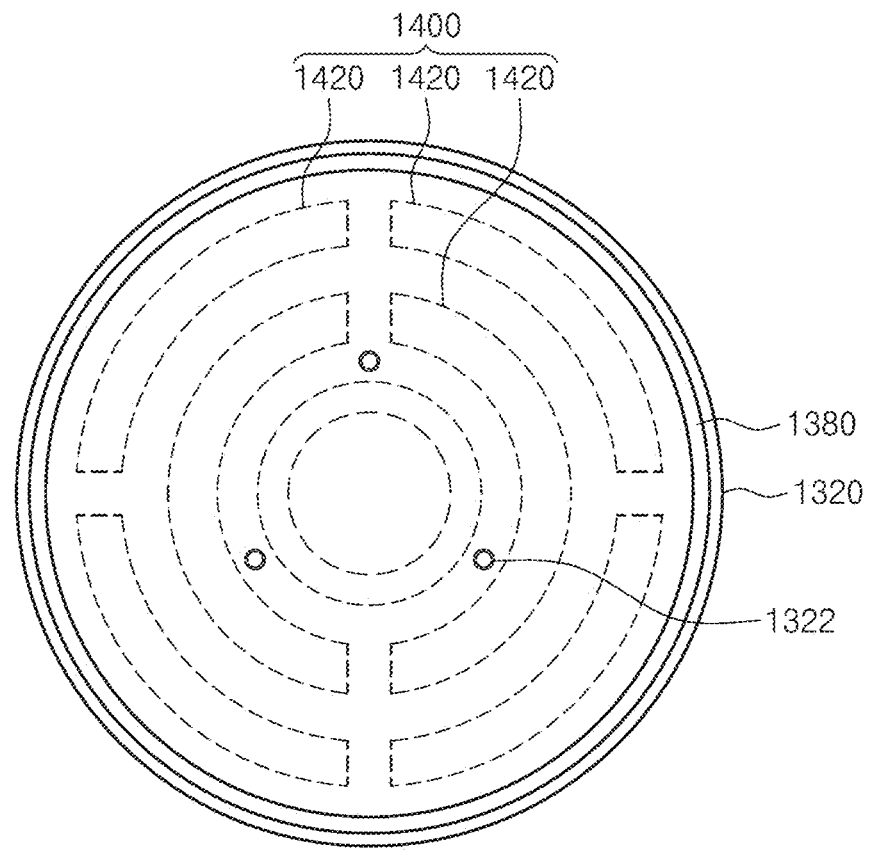
FIG. 8 is a plan view illustrating a substrate support unit of FIG. 7.

The substrate support unit 1300 supports the substrate W in the process space 1110. FIG. 8 is a plan view illustrating the substrate support unit of FIG. 7. Referring to FIGS. 7 and 8, the substrate support unit 1300 is fixedly coupled to the lower body 1140. The substrate support unit 1300 includes a support plate 1320, support pins 1360, a pin assembly 1340, and a guide 1380. The support plate 1320 transfers, to the substrate W, heat generated from the heater unit 1400. The support plate 1320 has a circular plate shape. An upper surface of the support plate 1320 has a larger diameter than the substrate W. The support plate 1320 has pin holes 1322 and the support pins 1360 on an upper surface thereof. The pin holes 1322 are provided as spaces in which lift pins 1342 of the pin assembly 1340 are located. The support pins 1360 prevent the substrate W from making direct contact with the upper surface of the support plate 1320. The support pins 1360 may have a pin shape, the lengthwise direction of which is directed in the up-down direction, or may have a protrusion shape protruding upward. The support pins 1360 are fixed to a seating surface of the support plate 1320. Upper ends of the support pins 1360 are provided as contact surfaces making direct contact with the backside of the substrate W, and the contact surfaces have a shape that is convex upward. Accordingly, contact areas between the support pins 1360 and the substrate W may be minimized. For example, three pin holes 1322 may be provided, and more support pins 1360 than the pin holes 1322 may be provided.

The pin assembly 1340 includes a plurality of pins and raises the substrate W off the support plate 1320, or lowers the substrate W onto the support plate 1320. More specifically, the pin assembly 1340 raises the substrate W off the support pins 1360, or lowers the substrate W onto the support pins 1360. The pin assembly 1340 includes the lift pins 1342 and an actuator (not illustrated). As many lift pins 1342 as the pin holes 1322 are provided. The lift pins 1342 are located in the pin holes 1322, respectively. The lift pins 1342 have a pin shape that is directed in the vertical direction. The lift pins 1342 may be moved to a raised position or a lowered position in the pin holes 1322. Here, the raised position is a position in which the lift pins 1342 protrude upward from the pin holes 1322, and the lowered position is a position in which the lift pins 1342 are inserted into the pin holes 1322. More specifically, the raised position is a position in which upper ends of the lift pins 1342 are in a higher position than an upper end of the support plate 1320, and the lowered position is a position in which the upper ends of the lift pins 1342 are in a lower position than the upper end of the support plate 1320. The lift pins 1342 are movable to two or more different heights in the raised position. The actuator (not illustrated) moves the lift pins 1342 to the raised position and the lowered position. For example, the actuator (not illustrated) may be a motor. Accordingly, the actuator (not illustrated) may adjust the heights of the lift pins 1342 in a state in which the lift pins 1342 are located in the raised position.

The guide 1380 guides the substrate W to locate the substrate W in a correct position over the seating surface. The guide 1380 has an annular ring shape that surrounds the seating surface. The guide 1380 has a larger diameter than the substrate W. An inside surface of the guide 1380 has a shape downwardly inclined with an approach to the central axis of the support plate 1320. Accordingly, the substrate W supported on the inside surface of the guide 1380 is moved to the correct position along the inclined surface. Furthermore, the guide 1380 may slightly prevent a gas flow introduced between the substrate W and the seating surface.

The heater unit 1400 heats the substrate W placed on the support plate 1320. The heater unit 1400 is located under the substrate W placed on the support plate 1320. The heater unit 1400 includes a plurality of heaters 1420. The heaters 1420 are located inside the support plate 1320. Selectively, the heaters 1420 may be located on the bottom of the support plate 1320. The heaters 1420 are located on the same plane. According to an embodiment, the heaters 420 may heat different regions of the seating surface to different temperatures. Some of the heaters 1420 may heat a central region of the seating surface to a first temperature, and the other heaters 1420 may heat an edge region of the seating surface to a second temperature. The second temperature may be higher than the first temperature. The heaters 1420 may be printed patterns or heating wires.

Referring again to FIG. 7, the gas supplier 1500 includes a flow forming plate 1540 and a supply tube 1520. The flow forming plate 1540 has a circular plate shape with an opening. The flow forming plate 1540 is provided at a height corresponding to the upper body 1120. The supply tube 1520 receives a hydrophobic gas from the gas supply line 1610, which is connected to a as source (not shown) and functions as a dispensing member that dispenses the process gas onto the substrate W. The supply tube 1520 is inserted into the central hole 1124. The supply tube 1520 is provided such that a lower end thereof is located in the process space 1110 and an upper end thereof is located outside the process space 1110. The supply tube 1520 is fixedly coupled to the opening of the flow forming plate 1540. For example, the flow forming plate 1540 and the supply tube 1520 may be integrated with each other. The position of a dispensing end 1522 that is the lower end of the supply tube 1520 may be fixed. The bottom of the flow forming plate 1540 and the lower end of the supply tube 1520 may be provided at the same height. The flow forming plate 1540 divides the process space 1110 into an upper space 1110a and a lower space 1110b. The lower space 1110b may function as a space into which the process gas is introduced to treat the substrate W, and the upper space 1110a may function as an exhaust space through which the process gas is released. The flow forming plate 1540 has an outer diameter that is the same as the inner diameter of the upper body 1120. The flow forming plate 1540 has a plurality of exhaust holes 1524 formed in an edge region thereof. The exhaust holes 1542 are circumferentially arranged to surround the opening of the flow forming plate 1540. For example, when viewed from above, the exhaust holes 1542 may have a circular shape. Selectively, the exhaust holes 1542 may have an arc shape that surrounds an empty space. According to this embodiment, the exhaust holes 1542 are provided so as not to face the substrate W placed on the substrate support unit 1300. That is, when viewed from above, the exhaust holes 1542 may be circumferentially arranged to surround the periphery of the substrate W placed on the substrate support unit 1300. Process by-products passing through the exhaust holes 1542 are released to the outside through exhaust lines 1560 connected to the peripheral holes 1122. A pressure-reducing member 1580 is connected to the exhaust lines 1560, and the process by-products are released by exhaust pressure of the pressure-reducing member 1580. Accordingly, interference with the supply of the process gas to the edge region of the substrate W may be minimized. For example, the process gas may be hexamethyldisilane (HMDS) for surface modification of the substrate W. The process gas may have a property that is the same as, or similar to, that of a photosensitive liquid. The photosensitive liquid may have a hydrophobic property, and the process gas may be a hydrophobic gas having a hydrophobic property.

The controller 1900 controls the pin assembly 1340 in the substrate support unit 1300 and controls the gas supplier 1500. The controller 1900 controls the degree of hydrophobization of the substrate surface by adjusting the height of the substrate W. The controller 1900 adjusts the height of the substrate W depending on the degree to which the surface of the substrate W is desired to be hydrophobicized. Adjusting the height of the substrate W includes adjusting the distance between the substrate W and the dispensing end 1522 of the supply tube 1520. That is, to adjust the degree of hydrophobization of the substrate surface, the controller 1900 may adjust the distance between the substrate W and the dispensing end 1522. According to an embodiment, in a case of raising the degree of hydrophobization of the substrate surface, the distance between the substrate W and the dispensing end 1522 may be decreased, and in a case of lowering the degree of hydrophobization of the substrate surface, the distance between the substrate W and the dispensing end 1522 may be increased. That is, in the case of raising the degree of hydrophobization, the substrate W may be raised, and in the case of lowering the degree of hydrophobization, the substrate W may be lowered. In the case of raising the degree of hydrophobization, the lift pins 1342 may be moved to the raised position, and in the case of lowering the degree of hydrophobization, the lift pins 1342 may be moved to the lowered position.

Figure 9:
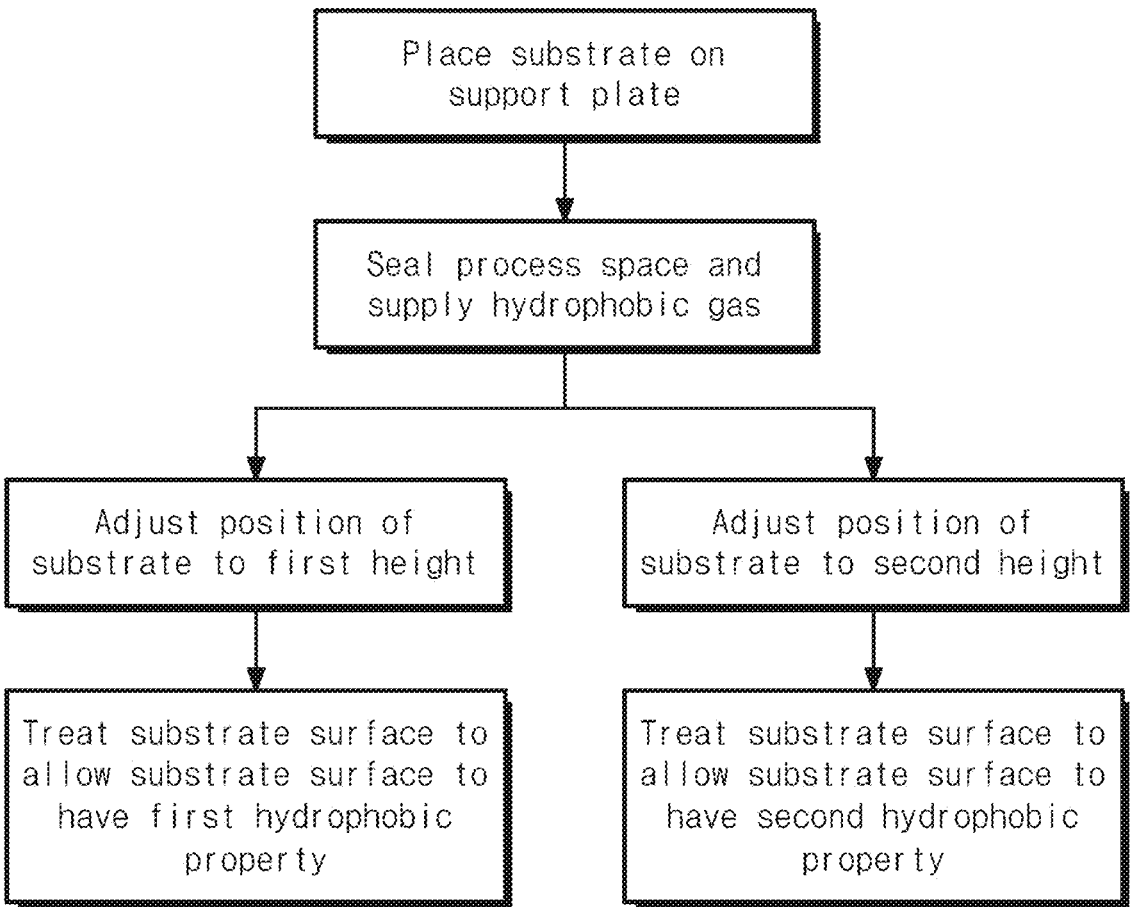
FIG. 9 is a flowchart illustrating a process of treating a substrate using the apparatus of FIG. 7.

Hereinafter, a process of treating the substrate W using the above-described apparatus will be described. Referring to FIG. 9, the lift pins 1342 are moved to the raised position and receive the substrate W from the transfer robot 3422. The lift pins 1342 are moved to the lowered position such that the substrate W is placed on the support pins 1360. Thereafter, the upper body 1120 is moved from the open position to the closed position and seals the process space 1110 from the outside. For example, even though the substrate W is treated in a position spaced apart from the support plate 1320, the substrate W is lowered onto the support pins 1360 and raised again after the chamber 1100 is sealed from the outside. The aim is to prevent misalignment of the substrate W in consideration of the stability of the substrate W, when the chamber 110 is moved in a state in which the substrate W is placed on the lift pins 1342. When the process space 1110 is sealed from the outside, a hydrophobic gas is supplied from the dispensing end 1522 of the supply tube 1520. The hydrophobic gas is supplied to the substrate W and hydrophobicizes the surface of the substrate W. In the process of hydrophobicizing the surface of the substrate W, the position of the substrate W is adjusted for adjustment of the degree of hydrophobization of the substrate surface.

In this embodiment, the controller 1900 may adjust the degree of hydrophobization by adjusting the distance between the substrate W and the dispensing end 1522 by adjusting the height of the substrate W. To perform surface modification of the substrate W such that the surface of the substrate W has a first hydrophobic property or a second hydrophobic property smaller than the first hydrophobic property, the height of the substrate W may be differently adjusted. To perform surface modification of the substrate W such that the surface of the substrate W has the first hydrophobic property, the substrate W is raised off the support pins 1360 and moved upward to the first height. The first height may be a height at which the substrate W is spaced apart from the support pins 1360. Alternatively, to perform surface modification of the substrate W such that the surface of the substrate W has the second hydrophobic property, the substrate W is lowered to the second height lower than the first height. The second height may be a height at which the substrate W is spaced apart from the support pins 1360, or may be a height at which the substrate W is placed on the support pins 1360. In this embodiment, the second height is described as a height at which the substrate W is placed on the support pins 1360. At the first height, the distance between the dispensing end 1522 and the substrate W is smaller than that at the second height. Accordingly, the surface of the substrate W located at the first height may have a hydrophobic property greater than that of the surface of the substrate W located at the second height.

A method for treating a first substrate $W_1$ and a second substrate $W_2$ such that the first substrate $W_1$ and the second substrate $W_2$ have different degrees of hydrophobization will be described. In this embodiment, the first substrate $W_1$ is treated such that a surface of the first substrate $W_1$ has a first hydrophobic property, and the second substrate $W_2$ is treated such that a surface of the second substrate $W_2$ has a second hydrophobic property. In the same chamber 1100, a hydrophobization process is performed on the first substrate $W_1$ and the second substrate $W_2$.

Figure 10:
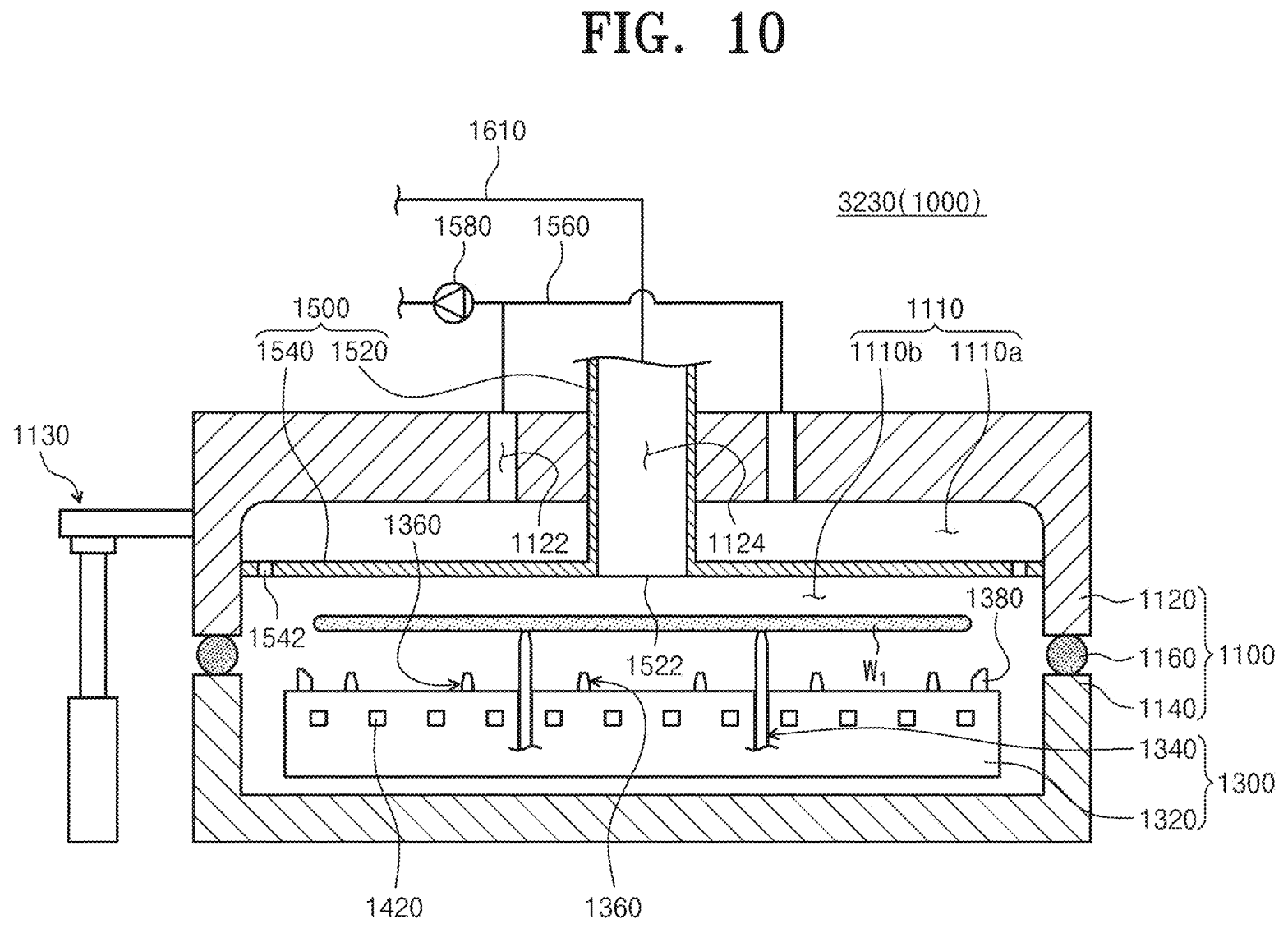
Figure 11:
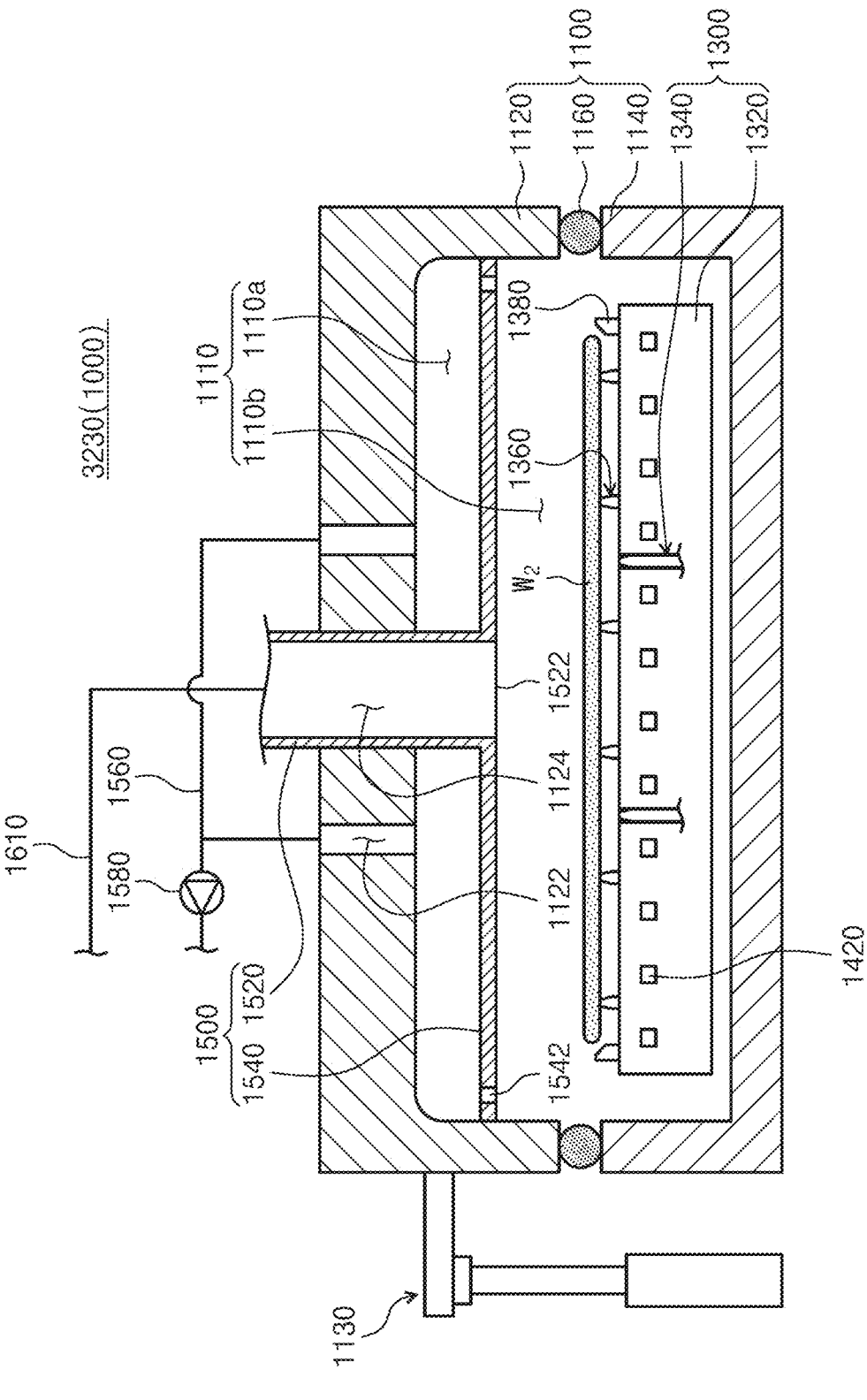
FIG. 11 is a view illustrating a process of treating a second substrate in the apparatus of FIG. 7.

Referring to FIGS. 10 and 11, the process space 1110 is sealed from the outside, the first substrate $W_1$ is moved to the first height by the lift pins 1342, and the second substrate $W_2$ is located at the second height at which the second substrate $W_2$ is placed on the support pins 1360. A hydrophobic gas is supplied at the same flow rate in a first treatment step of hydrophobicizing the first substrate $W_1$ and a second treatment step of hydrophobicizing the second substrate $W_2$. Furthermore, the same type of hydrophobic gas is supplied in the first treatment step and the second treatment step. Accordingly, the first substrate $W_1$ and the second substrate $W_2$ may have different degrees of hydrophobization even though the first treatment step and the second treatment step are performed in the same environment such as the same flow rate, the same type of hydrophobic gas, and the like.

Referring again to FIGS. 5 and 6, the transfer plate 3240 has a substantially circular plate shape and has a diameter corresponding to the diameter of the substrate W. The transfer plate 3240 has notches 3244 formed at the edge thereof. The notches 3244 may have a shape corresponding to the protrusions 3429 formed on the hand 3420 of the transfer robot 3422 described above. Furthermore, as many notches 3244 as the protrusions 3429 formed on the hand 3420 are formed in positions corresponding to the protrusions 3429. The substrate W is transferred between the hand 3420 and the transfer plate 3240 when the vertical positions of the hand 3420 and the transfer plate 3240 aligned with each other in the up-down direction are changed. The transfer plate 3240 may be mounted on a guide rail 3249 and may be moved between a first region 3212 and a second region 3214 along the guide rail 3249 by an actuator 3246. A plurality of guide grooves 3242 in a slit shape are formed in the transfer plate 3240. The guide grooves 3242 extend inward from the edge of the transfer plate 3240. The lengthwise direction of the guide grooves 3242 is parallel to the second direction 14, and the guide grooves 3242 are located to be spaced apart from each other along the first direction 12. The guide grooves 3242 prevent the transfer plate 3240 and the lift pins 1340 from interfering with each other when the substrate W is transferred between transfer plate 3240 and the heating unit 3230.

The substrate W is heated while the substrate W is directly placed on the support plate 1320. The substrate W is cooled while the transfer plate 3240 on which the substrate W is placed is brought into contact with the cooling plate 3222. For efficient heat transfer between the cooling plate 3222 and the substrate W, the transfer plate 3240 is formed of a material having a high heat transfer rate. According to an embodiment, the transfer plate 3240 may be formed of a metallic material.

The plurality of liquid treatment chambers 3600 are provided. Some of the liquid treatment chambers 3600 may be stacked on each other. The liquid treatment chambers 3600 are disposed on an opposite side of the transfer chamber 3400. The liquid treatment chambers 3600 are arranged side by side along the first direction 12. Some of the liquid treatment chambers 3600 are located adjacent to the index module 20. Hereinafter, these liquid treatment chambers are referred to as the front liquid treatment chambers 3602. Other liquid treatment chambers 3600 are located adjacent to the interface module 40. Hereinafter, these liquid treatment chambers are referred to as the rear liquid treatment chambers 3604.

Each of the front liquid treatment chambers 3602 applies a first liquid to the substrate W, and each of the rear liquid treatment chambers 3604 applies a second liquid to the substrate W. The first liquid and the second liquid may be different types of liquids. According to an embodiment, the first liquid is an anti-reflection film, and the second liquid is photoresist. The photoresist may be applied to the substrate W coated with the anti-reflection film. Selectively, the first liquid may be photoresist, and the second liquid may be an anti-reflection film. In this case, the anti-reflection film may be applied to the substrate W coated with the photoresist. Selectively, the first liquid and the second liquid may be of the same type. Both the first liquid and the second liquid may be photoresist.

Figure 12:
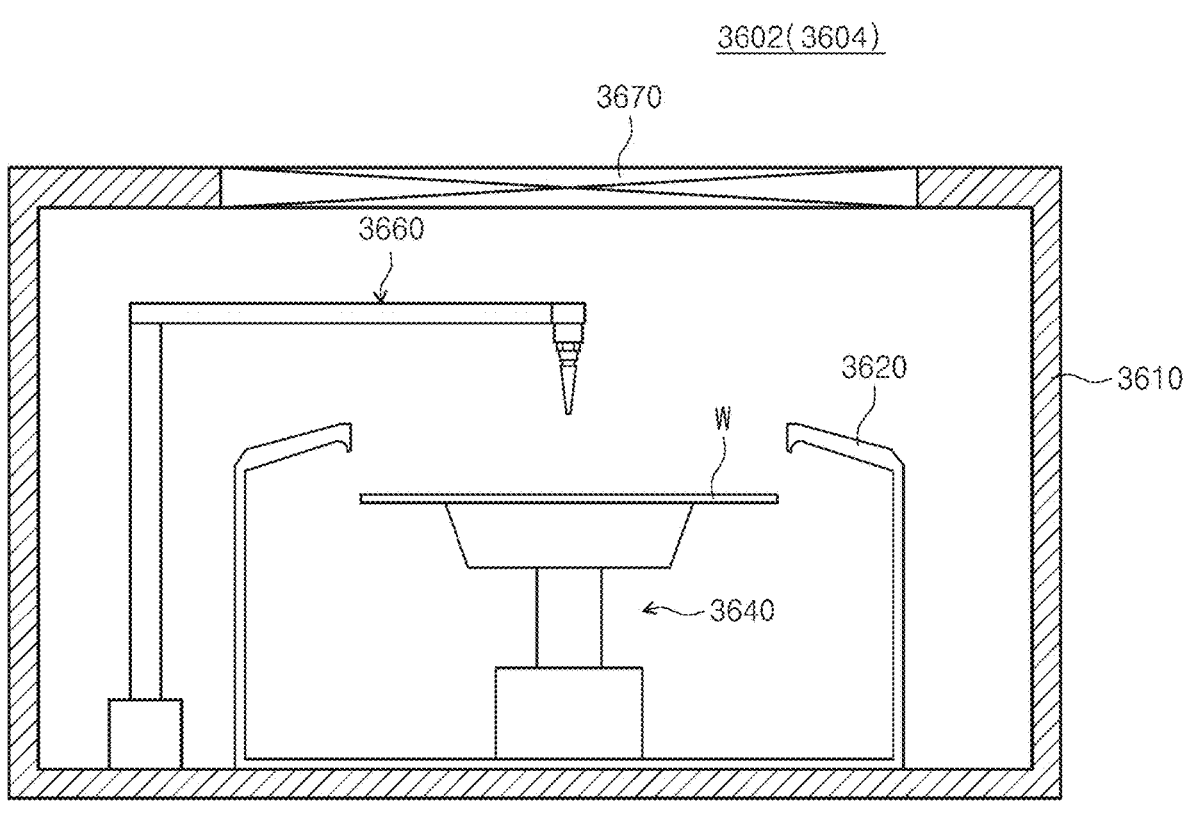
FIG. 12 is a schematic view illustrating one example of liquid treatment chambers of FIG. 3.

FIG. 12 is a schematic view illustrating one example of the liquid treatment chambers of FIG. 3. Referring to FIG. 12, the liquid treatment chamber 3600 has a housing 3610, a treatment vessel 3620, a substrate support unit 3640, and a liquid dispensing unit 3660. The housing 3610 has a substantially rectangular parallelepiped shape. The housing 3610 has, in a sidewall thereof, an entrance/exit opening (not illustrated) through which the substrate W enters and exits the housing 3610. The entrance/exit opening may be opened and closed by a door (not illustrated). The treatment vessel 3620, the substrate support unit 3640, and the liquid dispensing unit 3660 are provided in the housing 3610. A fan filter unit 3670 for forming a downward air flow in the housing 3260 may be provided in an upper wall of the housing 3610. The treatment vessel 3620 has a cup shape that is open at the top. The treatment vessel 3620 has a process space therein in which the substrate W is treated. The substrate support unit 3640 is disposed in the process space and supports the substrate W. The substrate support unit 3640 is provided such that the substrate W is rotatable during liquid treatment. The liquid dispensing unit 3660 dispenses a liquid onto the substrate W supported on the substrate support unit 3640.

The liquid dispensing unit 3660 includes a treatment liquid nozzle 3662. The treatment liquid nozzle 3662 dispenses a treatment liquid onto the substrate W supported on the substrate support unit 3640. For example, the treatment liquid may be a photosensitive liquid such as photoresist. The treatment liquid nozzle 3662 is moved between a process position and a standby position. Here, the process position is a position in which the treatment liquid nozzle 3662 is located above the substrate W supported on the substrate support unit 3640 and faces the substrate W, and the standby position is a position in which the treatment liquid nozzle 3662 deviates from the process position. The process position may be a position in which the treatment liquid nozzle 3362 is able to dispense the treatment liquid onto the center of the substrate W.

Referring again to FIGS. 2 and 3, the plurality of buffer chambers 3800 are provided. Some of the buffer chambers 3800 are disposed between the index module 20 and the transfer chamber 3400. Hereinafter, these buffer chambers are referred to as the front buffers 3802. The front buffers 3802 are stacked on each other along the up-down direction. The other buffer chambers 3800 are disposed between the transfer chamber 3400 and the interface module 40. These buffer chambers are referred to as the rear buffers 3804. The rear buffers 3804 are stacked on each other along the up-down direction. Each of the front buffers 3802 and the rear buffers 3804 temporarily stores a plurality of substrates W. The substrates W stored in the front buffers 3802 are loaded or unloaded by the index robot 2200 and the transfer robot 3422. The substrates W stored in the rear buffers 3804 are loaded or unloaded by the transfer robot 3422 and a first robot 4602.

A front transfer robot is located on one side of the front buffers 3802. The front transfer robot transfers the substrates W between the front buffers 3802 and the front heat treatment chamber 3202.

Each of the developing blocks 30b has heat treatment chambers 3200, a transfer chamber 3400, and liquid treatment chambers 3600. The heat treatment chambers 3200, the transfer chamber 3400, and the liquid treatment chambers 3600 of the developing block 30b are provided in a structure and an arrangement substantially similar to the structure and the arrangement in which the heat treatment chambers 3200, the transfer chamber 3400, and the liquid treatment chambers 3600 of the coating block 30a are provided, and therefore detailed descriptions thereabout will be omitted.

In the developing block 30b, the liquid treatment chambers 3600 are implemented with developing chambers 3600, each of which performs a developing process on the substrate W by dispensing a developing solution onto the substrate W.

The interface module 40 connects the treating module 30 with an external exposing apparatus 50. The interface module 40 has an interface frame 4100, an additional process chamber 4200, an interface buffer 4400, and a transfer member 4600.

The interface frame 4100 may have, at the top thereof, a fan filter unit that forms a downward air flow in the interface frame 4100. The additional process chamber 4200, the interface buffer 4400, and the transfer member 4600 are disposed in the interface frame 4100. Before the substrate W completely treated in the coating block 30a is transferred to the exposing apparatus 50, the additional process chamber 4200 may perform a predetermined additional process on the substrate W. Selectively, before the substrate W completely treated in the exposing apparatus 50 is transferred to the developing block 30b, the additional process chamber 4200 may perform a predetermined additional process on the substrate W. According to an embodiment, the additional process may be an edge exposing process of exposing the edge region of the substrate W to light, a top-side cleaning process of cleaning the top side of the substrate W, or a backside cleaning process of cleaning the backside of the substrate W. A plurality of additional process chambers 4200 may be provided. The additional process chambers 4200 may be stacked one above another. The additional process chambers 4200 may all perform the same process. Selectively, some of the additional process chambers 4200 may perform different processes.

The interface buffer 4400 provides a space in which the substrate W transferred between the coating block 30a, the additional process chambers 4200, the exposing apparatus 50, and the developing block 30b temporarily stays. A plurality of interface buffers 4400 may be provided. The interface buffers 4400 may be stacked one above another.

According to an embodiment, the additional process chambers 4200 may be disposed on one side of an extension line facing in the lengthwise direction of the transfer chamber 3400, and the interface buffers 4400 may be disposed on an opposite side of the extension line.

The transfer member 4600 transfers the substrate W between the coating block 30a, the additional process chambers 4200, the exposing apparatus 50, and the developing block 30b. The transfer member 4600 may be implemented with one or more robots. According to an embodiment, the transfer member 4600 has the first robot 4602 and a second robot 4606. The first robot 4602 may transfer the substrate W between the coating block 30a, the additional process chambers 4200, and the interface buffers 4400. An interface robot 4606 may transfer the substrate W between the inter- face buffers 4400 and the exposing apparatus 50. The second robot 4606 may transfer the substrate W between the inter- face buffers 4400 and the developing block 30b.

The first robot 4602 and the second robot 4606 each include a hand on which the substrate W is placed, and the hand is movable forward and backward, rotatable about an axis parallel to the third direction 16, and movable along the third direction 16.

The hands of the index robot 2200, the first robot 4602, and the second robot 4606 may all have the same shape as the hand 3420 of the transfer robot 3422. Selectively, a hand of a robot that directly exchanges the substrate W with the transfer plate 3240 of each heat treatment chamber 3200 may have the same shape as the hand 3420 of the transfer robot 3422, and hands of the remaining robots may have a different shape from the hand 3420 of the transfer robot 3422.

According to an embodiment, the index robot 2200 may directly exchange the substrate W with the heating unit 3230 of the front heat treatment chamber 3200 provided in the coating block 30a.

Furthermore, the transfer robots 3422 provided in the coating block 30a and the developing block 30b may directly exchange the substrate W with the transfer plate 3240 located in the heat treatment chamber 3200.

Hereinafter, one embodiment of a method for treating a substrate using the above-described substrate treating appa- ratus 1 will be described.

Coating process S20, edge exposing process S40, expos- ing process S60, and developing process S80 are sequen- tially performed on the substrate W.

Coating process S20 is performed by sequentially per- forming heat treatment process S21 in the heat treatment chamber 3200, anti-reflection film coating process S22 in the front liquid treatment chamber 3602, heat treatment process S23 in the heat treatment chamber 3200, photoresist film coating process S24 in the rear liquid treatment cham- ber 3604, and heat treatment process S25 in the heat treatment chamber 3200.

Hereinafter, one example of a transfer path of the sub- strate W from the carrier 10 to the exposing apparatus 50 will be described.

The index robot 2200 extracts the substrate W from the carrier 10 and transfers the substrate W to the front buffer 3802. The transfer robot 3422 transfers the substrate W stored in the front buffer 3802 to the front heat treatment chamber 3200. The substrate W is transferred to the heating unit 3230 by the transfer plate 3240. When a heating process is completely performed on the substrate W in the heating unit 3230, the transfer plate 3240 transfers the substrate W to the cooling unit 3220. In a state of supporting the substrate W, the transfer plate 3240 is brought into contact with the cooling unit 3220 and performs a cooling process on the substrate W. When the cooling process is completed, the transfer plate 3240 moves above the cooling unit 3220, and the transfer robot 3422 extracts the substrate W from the heat treatment chamber 3200 and transfers the substrate W to the front liquid treatment chamber 3602.

The front liquid treatment chamber 3602 coats the sub- strate W with an anti-reflection film.

The transfer robot 3422 extracts the substrate W from the front liquid treatment chamber 3602 and places the substrate W in the heat treatment chamber 3200. The heat treatment chamber 3200 sequentially performs the above-described heating and cooling processes. When each heat treatment process is completed, the transfer robot 3422 extracts the substrate W from the heat treatment chamber 3200 and places the substrate W in the rear liquid treatment chamber 3604.

Thereafter, the rear liquid treatment chamber 3604 coats the substrate W with a photoresist film.

The transfer robot 3422 extracts the substrate W from the rear liquid treatment chamber 3604 and places the substrate W in the heat treatment chamber 3200. The heat treatment chamber 3200 sequentially performs the above-described heating and cooling processes. When each heat treatment process is completed, the transfer robot 3422 transfers the substrate W to the rear buffer 3804. The first robot 4602 of the interface module 40 extracts the substrate W from the rear buffer 3804 and transfers the substrate W to the addi- tional process chamber 4200.

The additional process chamber 4200 performs an edge exposing process on the substrate W.

The first robot 4602 extracts the substrate W from the additional process chamber 4200 and transfers the substrate W to the interface buffer 4400.

The second robot 4606 extracts the substrate W from the interface buffer 4400 and transfers the substrate W to the exposing apparatus 50.

Developing process S80 is performed by sequentially performing heat treatment process S81 in the heat treatment chamber 3200, developing process S82 in the liquid treat- ment chamber 3600, and heat treatment process S83 in the heat treatment chamber 3200.

Hereinafter, one example of a transfer path of the sub- strate W from the exposing apparatus 50 to the carrier 10 will be described.

The second robot 4606 extracts the substrate W from the exposing apparatus 50 and transfers the substrate W to the interface buffer 4400.

The first robot 4602 extracts the substrate W from the interface buffer 4400 and transfers the substrate W to the rear buffer 3804. The transfer robot 3422 extracts the substrate W from the rear buffer 3804 and transfers the substrate W to the heat treatment chamber 3200. The heat treatment chamber 3200 sequentially performs a heating process and a cooling process on the substrate W. When the cooling process is completed, the substrate W is transferred to the developing chamber 3600 by the transfer robot 3422.

The developing chamber 3600 performs a developing process by dispensing a developing solution onto the sub- strate W.

The substrate W is extracted from the developing chamber 3600 and placed in the heat treatment chamber 3200 by the transfer robot 3422. The heat treatment chamber 3200 sequentially performs a heating process and a cooling process on the substrate W. When the cooling process is completed, the substrate W is extracted from the heat treatment chamber 3200 and transferred to the front buffer 3802 by the transfer robot 3422.

The index robot 2200 extracts the substrate W from the front buffer 3802 and transfers the substrate W to the carrier 10.

The treating module 30 of the substrate treating apparatus 1 has been described as performing the coating process and the developing process. However, the substrate treating apparatus 1 may include only the index module 20 and the treating module 30 without the interface module 40. In this case, the treating module 30 may perform only the coating process, and a film with which the substrate W is coated may be a spin-on hardmask (SOH) film.

As described above, according to the embodiments of the inventive concept, the degree of hydrophobization of a substrate surface may be adjusted by adjusting the position of a substrate.

Furthermore, according to the embodiments of the inventive concept, in adjusting the degree of hydrophobization of a substrate surface, it is not necessary to adjust the flow rate of a hydrophobic gas.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for treating a substrate, the method comprising:

a first treatment step of hydrophobicizing a surface of a first substrate such that the surface of the first substrate has a first hydrophobic property, by supplying a hydrophobic gas to the first substrate at a flow rate and through a supply tube inserted into a central hole included in a flow forming plate, the flow forming plate being in a chamber and dividing a process space of the chamber into an upper space and a lower space, a bottom of the flow forming plate and a lower end of the supply tube being at a same height;

a second treatment step of hydrophobicizing a surface of a second substrate such that the surface of the second substrate has a second hydrophobic property, by supplying the hydrophobic gas to the second substrate at the flow rate through the supply tube, and an exhaust step of releasing process by-products through a plurality of exhaust holes included in an edge region of the flow forming plate, wherein the first hydrophobic property and the second hydrophobic property is configured to have different degrees of hydrophobization by controlling a first distance between a dispensing end through which the hydrophobic gas is dispensed and the first substrate in the first treatment step to be different from a second distance between the dispensing end through which the hydrophobic gas is dispensed and the second substrate in the second treatment step, the first substrate is a substrate different from the second substrate, and the controlling the first distance to be different from the second distance includes causing the first substrate and the second substrate to be raised or lowered on a support plate within a substrate treating apparatus.

2. The method of claim 1, wherein the first hydrophobic property has a higher degree of hydrophobization than the second hydrophobic property, and the first distance is smaller than the second distance.

3. The method of claim 2, wherein the first treatment step and the second treatment step are performed in a same chamber.

4. The method of claim 3, wherein the dispensing end through which the hydrophobic gas is dispensed faces the support plate configured to support the first substrate and the second substrate and is located to overlap the support plate when viewed from above.

5. The method of claim 4, wherein the dispensing end is located to face a center of the first substrate and a center of the second substrate.

6. The method of claim 1, wherein the hydrophobic gas includes a hexamethyldisilane (HMDS) gas.

* * * * *